United States Patent
Ker et al.

(10) Patent No.: US 7,738,223 B2
(45) Date of Patent: Jun. 15, 2010

(54) ACTIVE DEVICE ARRAY SUBSTRATE HAVING ELECTROSTATIC DISCHARGE PROTECTION CAPABILITY

(75) Inventors: Ming-Dou Ker, Hsinchu County (TW); Chih-Kang Deng, Taipei County (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 174 days.

(21) Appl. No.: 11/842,177

(22) Filed: Aug. 21, 2007

(65) Prior Publication Data
US 2008/0106835 A1 May 8, 2008

(30) Foreign Application Priority Data
Nov. 8, 2006 (TW) .............................. 95141283 A

(51) Int. Cl.
*G02F 1/1333* (2006.01)
(52) U.S. Cl. .......................................... 361/56; 349/40
(58) Field of Classification Search .................. 361/56, 361/111; 349/40
See application file for complete search history.

(56) References Cited

U.S. PATENT DOCUMENTS

| | | | | |
|---|---|---|---|---|
| 5,220,443 A | | 6/1993 | Noguchi | |
| 5,606,340 A | * | 2/1997 | Suzuki et al. | 345/87 |
| 6,069,782 A | * | 5/2000 | Lien et al. | 361/111 |
| 6,337,722 B1 | * | 1/2002 | Ha | 349/40 |
| 6,493,047 B2 | | 12/2002 | Ha | |
| 6,696,701 B2 | | 2/2004 | Hector et al. | |
| 2002/0018154 A1 | | 2/2002 | Yoo et al. | |
| 2005/0099744 A1 | * | 5/2005 | Kitagawa | 361/56 |
| 2007/0146564 A1 | * | 6/2007 | Wu et al. | 349/40 |

FOREIGN PATENT DOCUMENTS

JP 2005055871 3/2005

* cited by examiner

*Primary Examiner*—Danny Nguyen
(74) *Attorney, Agent, or Firm*—Jianq Chyun IP Office

(57) ABSTRACT

An active device array substrate includes pixel units, scan lines, data lines, electrostatic discharge (ESD) protection elements, a short ring and an ESD biased generator. Each pixel unit is electrically connected to the corresponding scan line and data line. Each ESD protection element has a first connection terminal, a second connection terminal and a third connection terminal, wherein the first connection terminal is electrically connected to one of the corresponding scan line and data line, the second connection terminal is electrically connected to the short ring, and the third connection terminal is electrically connected to the ESD biased generator. As an ESD stress occurs, the ESD biased generator provides a voltage to the ESD protection elements to turn on them. It causes that the accumulated electrostatic charges are conducted into the lowest potential of the substrate through the short rings, so as to prevent the pixel units from ESD damaging.

17 Claims, 12 Drawing Sheets

US 7,738,223 B2

ACTIVE DEVICE ARRAY SUBSTRATE HAVING ELECTROSTATIC DISCHARGE PROTECTION CAPABILITY

CROSS-REFERENCE TO RELATED APPLICATION

This application claims the priority benefit of Taiwan application serial no. 95141283, filed Nov. 8, 2006. All disclosure of the Taiwan application is incorporated herein by reference.

BACKGROUND OF THE INVENTION

1. Field of Invention

The present invention relates to an active device array substrate, and particularly to an active device array substrate with an electrostatic discharge (ESD) protection circuit.

2. Description of the Related Art

Along with the modern video technology progress, liquid crystal display (LCD) apparatuses have been largely used as display screens in various electronic products, such as mobile phones, notebook computers, PCs and personal digital assistants (PDAs). In general, an LCD includes a thin film transistor (TFT) array substrate, a color filter substrate and a liquid crystal layer, wherein the TFT array substrate and the color filter substrate are assembled together, and the liquid crystal layer is located between the TFT array substrate and the color filter substrate. By means of all the TFTs in the TFT array substrate to modulate the orientations of the liquid crystal molecules in the liquid crystal layer, the light beam intensity is controlled for displaying images.

During a process for fabricating an LCD apparatus, however, the manufacturing equipment, the operators and the TFT array substrate itself are likely accumulated with a lot of electrostatic discharges, i.e. ESD stressed. Thus, once the TFT array substrate is contacted with the manufacturing equipment, the operators or other charged objects during the production process, an ESD phenomenon is triggered. Due to the fine conductive traces and elements of a TFT array substrate, a minor ESD event often causes a serious result where the affected LCD apparatus is entirely discarded. In order to solve the problem that an ESD event damages an LCD apparatus, a TFT array substrate usually includes an ESD protection circuit.

FIG. 1 is a diagram of a conventional TFT array substrate. Referring to FIG. 1, a conventional TFT array substrate 100 includes pixel units 110, scan lines 120, data lines 130, bonding pads 140, back-to-back diodes 150 and a short ring 160. Each pixel unit 110 includes a TFT 112 and a pixel electrode 114, and the pixel units 110 arranged in an array are electrically connected to the corresponding scan lines 120 and data lines 130, respectively. An end of each scan line 120 and an end of each data line 130 are electrically connected to the corresponding bonding pads 140, while the bonding pads 140 are electrically connected to the short ring 160 via the corresponding back-to-back diodes 150.

The back-to-back diode 150 has a turned on voltage which is adding up a forward-biased voltage of a diode and a reveries-biased voltage of a diode. When an ESD stress occurs on the TFT array substrate 100, the voltage of the built-up electrostatic charges is usually larger than the turn-on voltage of the back-to-back diode 150 so as to turn on the back-to-back diode 150. Consequently, the electrostatic charges would be conducted to the short ring 160 through the back-to-back diode 150, so as to avoid the electrostatic charges from flowing into the pixel units 110 to damage the TFTs 112. On the other hand, during testing the TFT array substrate 100, the testing operation voltage is normally not larger than the turn-on voltage of the back-to-back diode 150, thus an open circuit status is presented between the bonding pad 140 and the short ring 160. That is, there is no interactive voltage influence between the scan line 120 and the data line 130 to affect the normal operations of the pixel units 110.

In order to avoid large current leakage occurs in the back-to-back diode 150 to affect the operation signals between the scan line 120 and the data line 130, it is better that the turned on voltage of the back-to-back diode 150 is larger so as to reduce the effect to the TFT array substrate 100. However, if the turned on voltage of the back-to-back diode 150 is increased, the pixel units 110 are damaged by the ESD charges when the TFT array substrate 100 is subjected to the ESD stress occurred inside or outside the TFT array substrate 100. Therefore, how to design the turned on voltage of the back-to-back diode 150 is important.

After the TFT array substrate 100 is completely fabricated, the wiring circuits between all the bonding pads 140 and the short ring 160 are electrically cut off, following by the subsequent processes. During the successive assembly process however, the TFT array substrate 100 likely accumulates electrostatic charges, and at the point, the TFT array substrate 100 has disabled the ESD protection function already, which puts the TFT array substrate 100 in jeopardy to be damaged by an ESD event.

FIG. 2 is a diagram of another conventional TFT array substrate. Referring to FIG. 2, the conventional TFT array substrate 200 includes pixel units 210, scan lines 220, data lines 230, bonding pads 240, bi-forward diodes 250 and a first short ring 260, a second short ring 270 and a power control circuit 280. The pixel units 210 are electrically connected to the corresponding scan lines 220 and data lines 230, respectively. An end of each scan line 220 and an end of each data line 230 are electrically connected to the corresponding bonding pads 240. Each of the bi-forward diodes 250 includes two diodes 250a and 250b, while the bonding pads 240 are electrically connected to the first short ring 260 via the corresponding diodes 250a and then electrically connected to the second short ring 270 via the corresponding diodes 250b. In addition, the power control circuit 280 is electrically connected to the first short ring 260 and the second short ring 270.

As an ESD event occurs, all of the three voltage levels of the power supply 290 are 0V. When the accumulated electrostatic charges are conducted to the first short ring 260 via the diode 250a or 250b and then conducted to the second short ring 270 through the power control circuit 280, the ESD charges are rapidly transferred to the lowest voltage level on the TFT array substrate 200. Thereby, the accumulated electrostatic charges are neutralized so as to avoid the accumulated electrostatic charges from flowing into the pixel units 210 on the TFT array substrate 200 to cause fatal failure. On the other hand, prior to operating the TFT array substrate 200, a power supply 290 is electrically connected to the ESD protection circuit 280 to provide the ESD protection circuit 280 with a high voltage $V_{dd}$, a low voltage $V_{ss}$ and a medium voltage $V_m$. Hence, the ESD protection circuit 280 is able to keep the first short ring 260 in the high voltage $V_{dd}$ and keep the second short ring 270 in the low voltage $V_{ss}$. Note that the operation voltage for the TFT array substrate 200 is between the high voltage $V_{dd}$ and the low voltage $V_{ss}$, thus each diode 250a and each diode 250b are reversely biased, which establishes open circuit statuses between the bonding pads 240 and the first short ring 260, and between the bonding pads 240 and the second short ring 270. That is, there is no interactive voltage influence between the scan lines 220 and the data lines 230 to affect the normal operations of the pixel units 210.

In the conventional method, the first and second short ring 260, 270 are electrically cut off, following by the subsequent processes. During the successive assembly process however, the TFT array substrate 200 likely accumulates electrostatic charges, and at the point, the TFT array substrate 200 has disabled the ESD protection function already, which puts the TFT array substrate 100 in jeopardy to be damaged by an ESD event.

SUMMARY OF THE INVENTION

Based on the above described, the present invention is to provide an active device array substrate having better ESD protection capability.

The present invention provides an active device array substrate, which includes scan lines, data lines, pixel units, ESD protection elements, a first short ring and an ESD biased generator. The pixel units are electrically connected to the corresponding scan lines and data lines, respectively. Each of the ESD protection elements has a first connection terminal, a second connection terminal and a third connection terminal and optionally further has a fourth connection terminal, wherein the first connection terminal is electrically connected to one of the corresponding scan line and data line, the second connection terminal is electrically connected to the short ring, the third connection terminal (and the fourth connection terminal) is/are electrically connected to the ESD biased generator. As an ESD stress occurs, the ESD biased generator would sense the electrostatic voltage and provide a voltage level to the ESD protection elements to turn on them for conducting the accumulated electrostatic charges into the short rings. Thereby, the electrostatic charges are transferred to the lowest voltage level on the active device array substrate and are neutralized, such that the pixel units of the active device array substrate are prevented from damaging.

In one embodiment, the ESD protection element has three connection terminals, and the ESD biased generator comprises a level controller having a node. The node is electrically connected to the third connection terminals of the ESD protection elements.

In one embodiment, the ESD protection element has four connection terminals, and the ESD biased generator comprises a level controller and an inverter having a node. The node is electrically connected to the third connection terminals of the ESD protection elements and an input terminal of the inverter, while an output terminal of the inverter is electrically connected to the fourth connection terminals of the ESD protection elements.

In one embodiment, the level controller comprises at least a diode in forward series and a resistor connected in series to the diode.

In one embodiment, the level controller comprises at least a transistor and a resistor electrically connected to the transistor, and the source electrode of the transistor is electrically connected to the drain electrode of the adjacent transistor and the gate electrode of the transistor is electrically connected to one of the source and drain electrode thereof.

In one embodiment, the level controller comprises at least a resistor in series.

In one embodiment, the ESD protection element comprises an N type transistor. The ESD protection element further comprises two resistors, and the two resistors are electrically connected between the first connection terminal and the third connection terminal, and between the second connection terminal and the third connection terminal, respectively. In addition, the ESD protection element further comprises two capacitors, and the two capacitors are electrically connected between the first connection terminal and the third connection terminal, and between the second connection terminal and the third connection terminal, respectively.

In one embodiment, the ESD protection element comprises a P type transistor. The ESD biased generator further comprises an inverter electrically connected between the node and the third connection terminals of the ESD protection elements. In addition, the ESD protection element further comprises two resistors, and the two resistors are electrically connected between the first connection terminal and the third connection terminal and between the second connection terminal and the third connection terminal, respectively. Moreover, the ESD protection element further comprises two capacitors, and the two capacitors are electrically connected between the first connection terminal and the third connection terminal and between the second connection terminal and the third connection terminal, respectively.

In summary, as an ESD stress occurs in an active device array substrate of the present invention, the ESD biased generator would sense the electrostatic voltage and provide a voltage level to the ESD protection elements to turn on them for conducting the accumulated electrostatic charges into the short rings. Thereby, the electrostatic charges are transferred to the lowest voltage level on the substrate and are neutralized. In this way, the active device array substrate of the present invention has the desired ESD protection function to avoid the pixel units from damage caused by an ESD.

BRIEF DESCRIPTION OF THE DRAWINGS

The accompanying drawings are included to provide a further understanding of the invention, and are incorporated in and constitute a part of this specification. The drawings illustrate embodiments of the invention and together with the description, and serve for explaining the principles of the invention.

DESCRIPTION OF THE EMBODIMENTS

Figure 1:
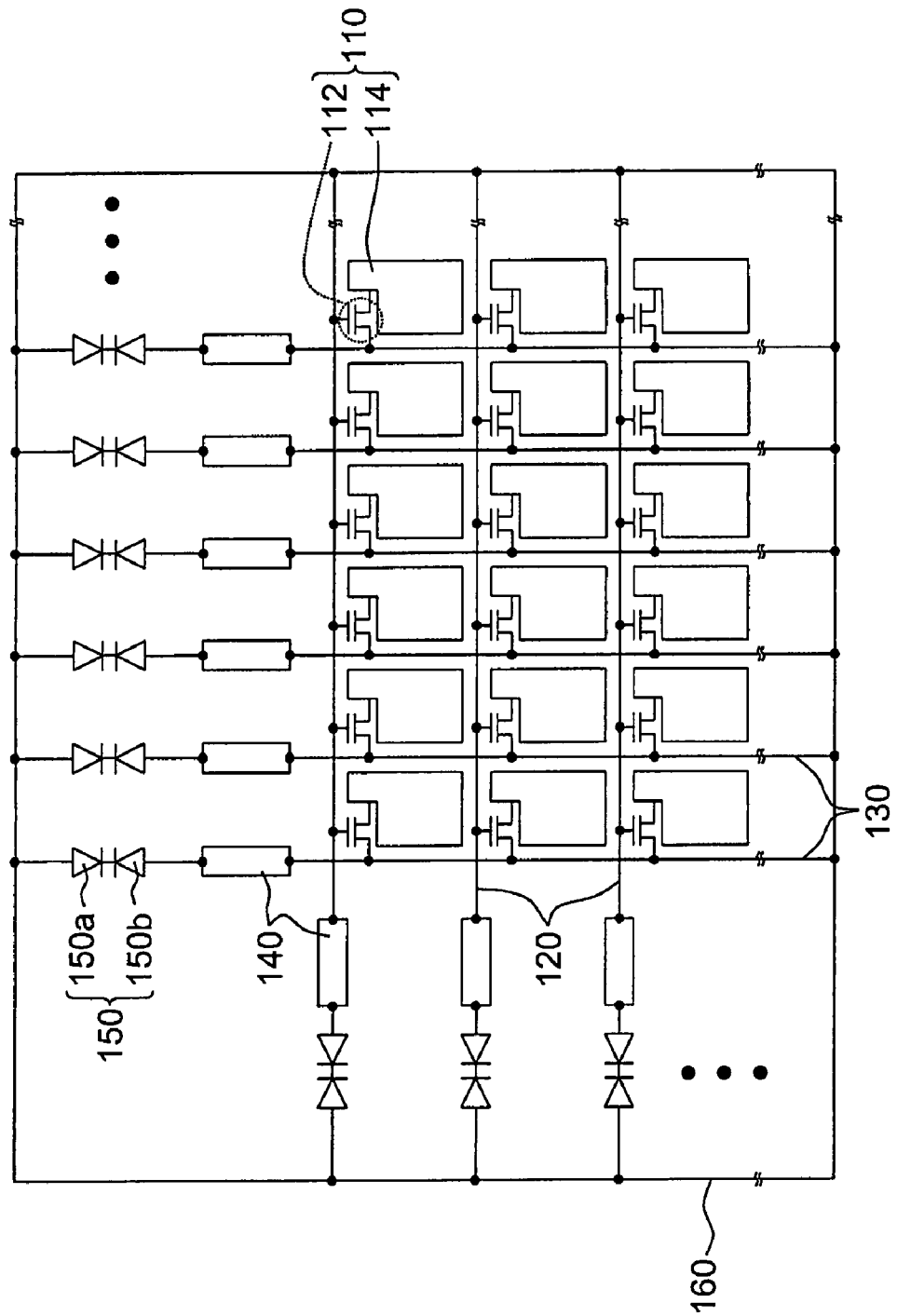
FIG. 1 is a diagram of a conventional TFT array substrate.
Figure 2:
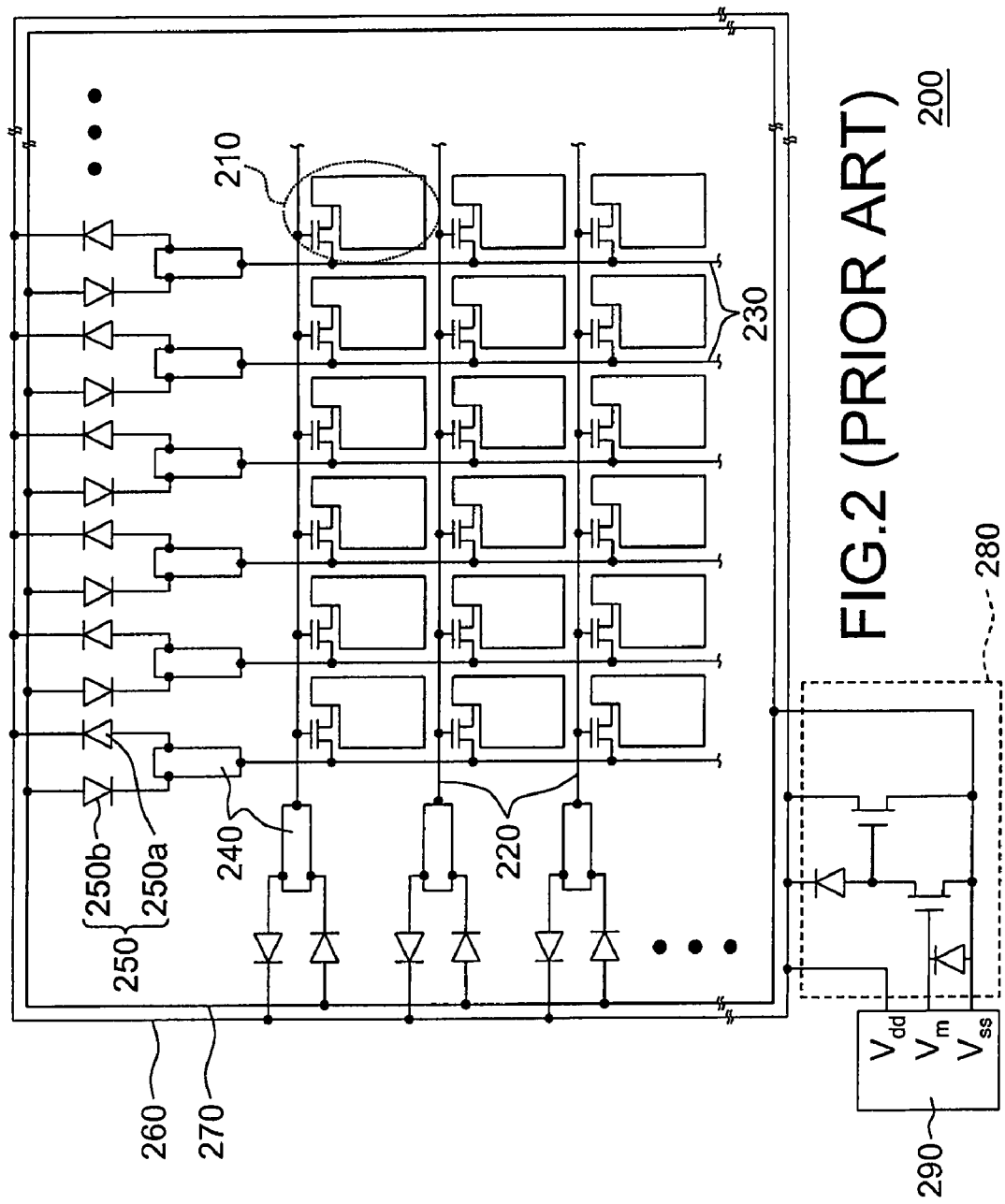
FIG. 2 is a diagram of another conventional TFT array substrate.
Figure 3:
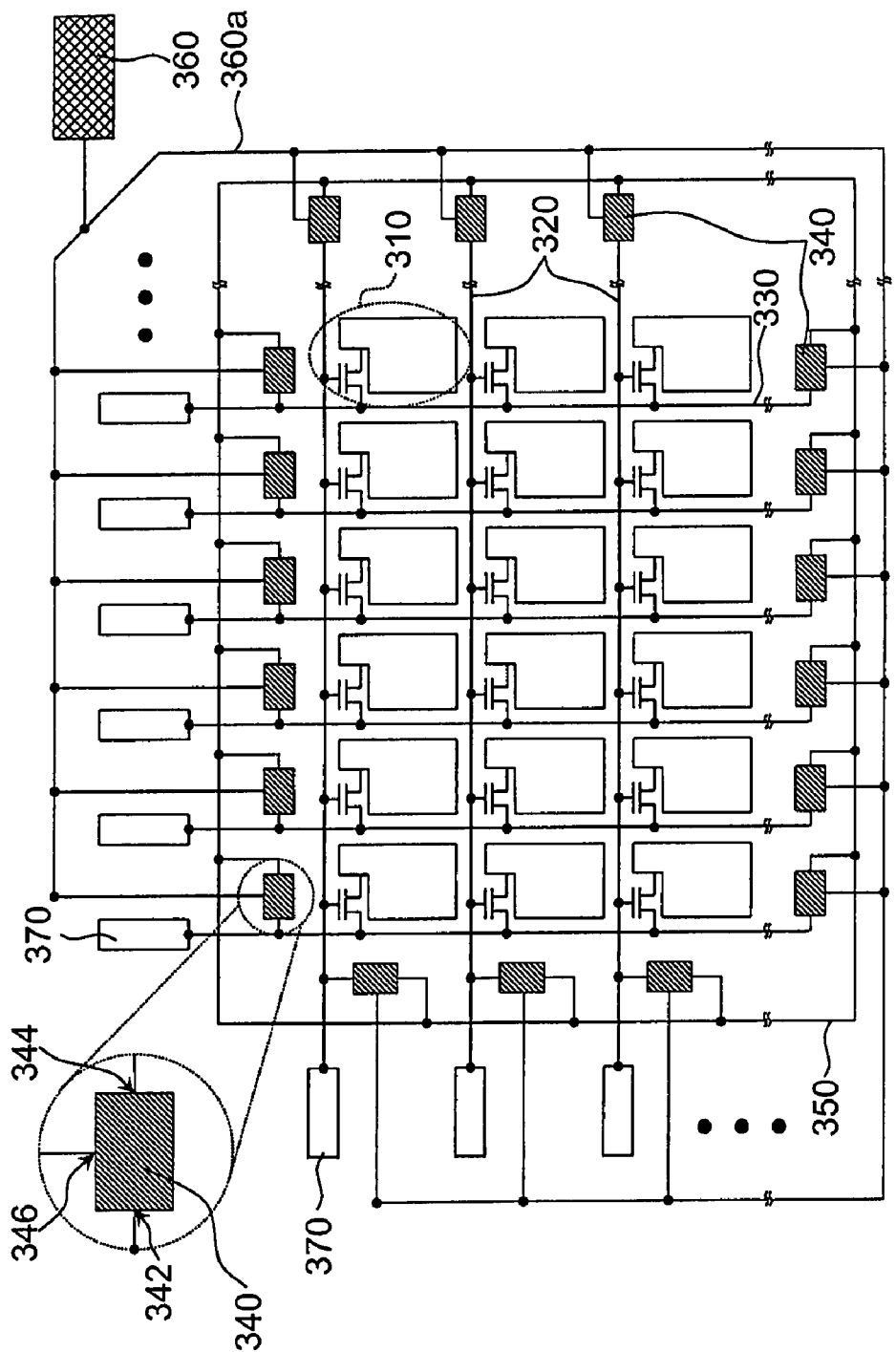
FIG. 3 is a diagram of an active device array substrate according to an embodiment of the present invention.

FIG. 3 is a diagram of an active device array substrate according to an embodiment of the present invention. Referring to FIG. 3, an active device array substrate 300 of the present invention includes a plurality of pixel units 310, a plurality of scan lines 320, a plurality of data lines 330, a plurality of ESD protection elements 340, a short ring 350 and an ESD biased generator 360. The pixel units 310 are arranged in array and electrically connected to the corresponding scan lines 320 and data lines 330, respectively. Each of the ESD protection elements 340 has a first connection terminal 342, a second connection terminal 344, a third connection terminal 346, wherein the first connection terminal 342 is electrically connected to one of the corresponding scan line 320 and data line 330, the second connection terminal 344 is electrically connected to the short ring 350, the third connection terminal 346 is electrically connected to the ESD biased generator 360. In more detail, the third connection terminal 346 of each ESD protection elements 340 is electrically connected to a conductive wire 360a, while the conductive wire 360a is electrically connected to the ESD biased generator 360.

The active device array substrate 300 may further include a plurality of bonding pads 370, and an end of each scan line 320 and each data line 330 are electrically connected to the corresponding bonding pads 370. In this way, any two bonding pads 370 are electrically connected to each other via two ESD protection elements 340 and the short ring 350. As the ESD protection elements 340 are turn on, the charges on any bonding pad 370 are able to be quickly conducted to the short ring 350 or other bonding pads 370, so as to keep a potential balance. In addition, each bonding pad 370 can be further electrically connected to the ESD biased generator 360 via, for example, an ESD protection element.

Figure 4:
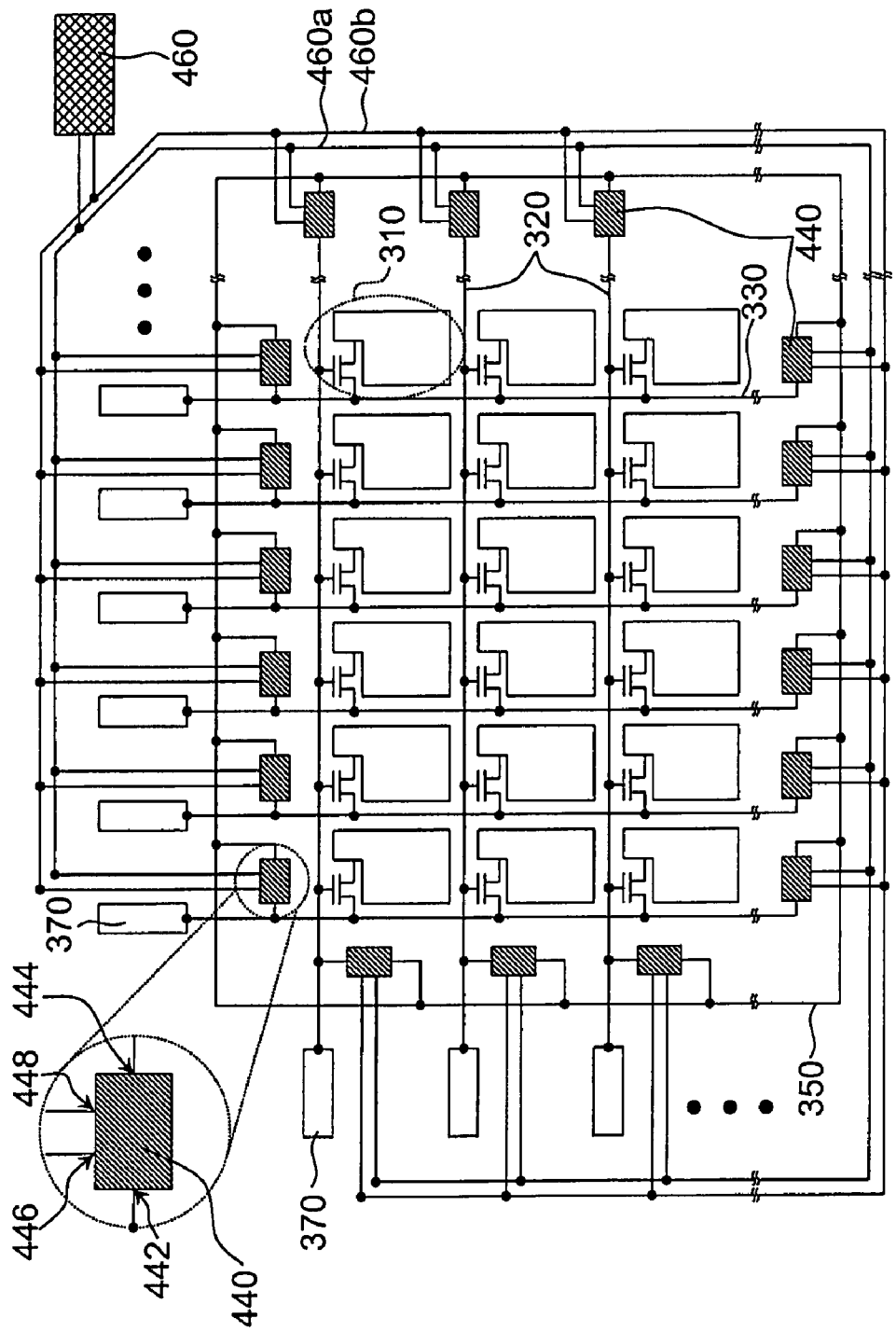
FIG. 4 is a diagram of an active device array substrate according to another embodiment of the present invention.

According to another embodiment of the present invention, the ESD protection element on the active device array substrate can also have four connection terminals. Referring to FIG. 4, the structure of FIG. 4 is similar to FIG. 3, and the different between the two structures is the ESD protection element 440 has a first connection terminal 442, a second connection terminal 444, a third connection terminal 446 and a fourth connection terminal 448. The ESD protection element 440 is a transmission-gate transistor composed of an N type transistor and a P type transistor.

Figure 5A:
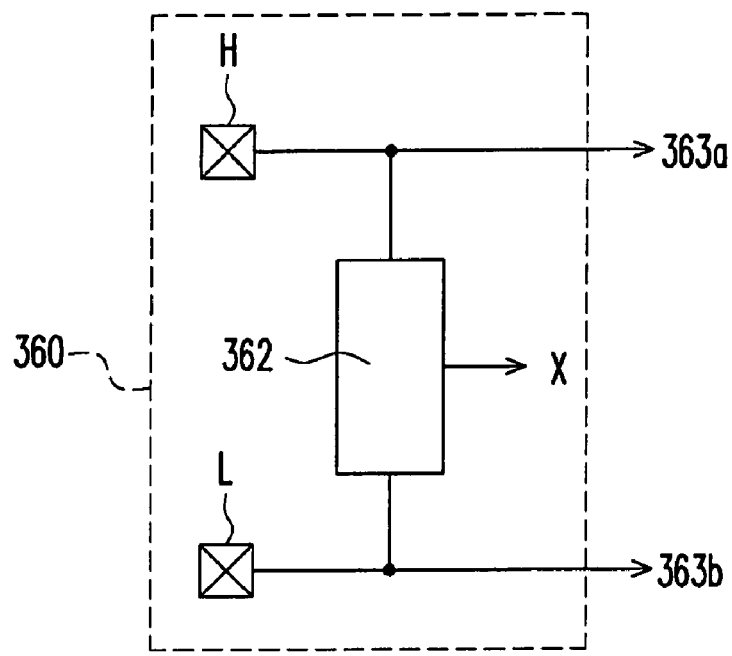
FIGS. 5A-5C are diagrams showing the ESD biased generator.

FIG. 5A is diagram showing the ESD biased generator used in the active device array substrate of FIG. 3. Referring to FIG. 5A, the ESD biased generator 360 has a plurality of terminals electrically connected to a high voltage terminal H, a low voltage terminal L and a node X. The ESD biased generator 360 further has a level controller 362 therein. The ESD biased generator 360 is further electrically connected to the diode 363a and the diode 363b. Each of the bonding pads 370 on the active device array substrate shown in FIG. 3 is connected to one of the diodes 363a, 363b. When an ESD event occurs and a normal operation is performed, the ESD biased generator 360 would generate voltage levels VESD, VOFF on the node X. The diodes 363a, 363b are respectively a PIN diode, a PPN diode, a diode connected with an N type transistor or a diode connected with a P type transistor, for example.

Figure 5B:
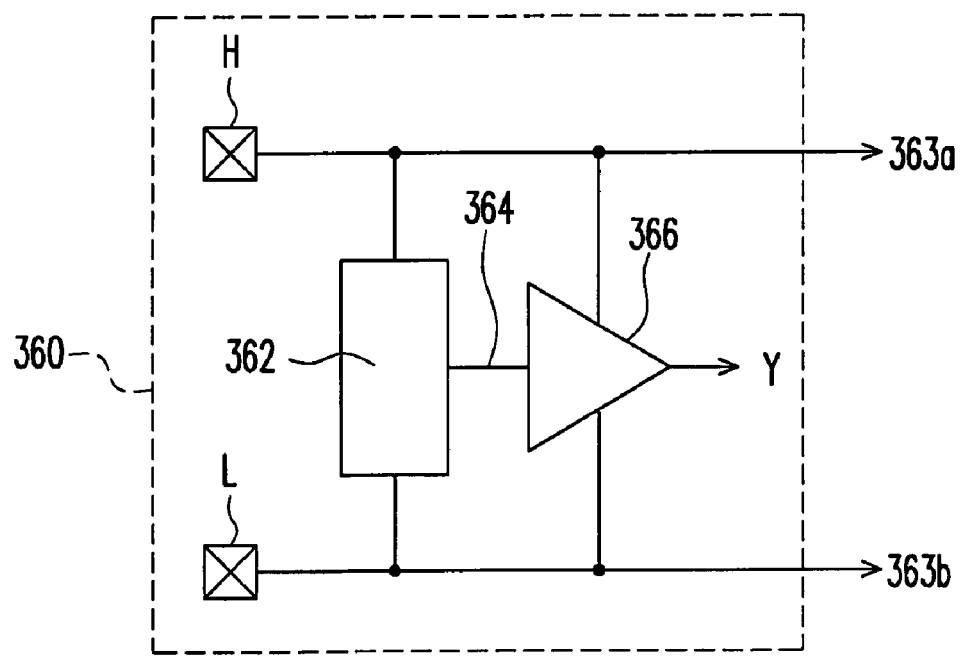

In another embodiment, as shown in FIG. 5B, the ESD biased generator 360 has a plurality of terminals electrically connected to a high voltage terminal H, a low voltage terminal L and a node Y. The ESD biased generator 360 further has a level controller 362 and an inverter 366 therein. The ESD biased generator 360 is further electrically connected to the diode 363a and the diode 363b. When an ESD event occurs and a normal operation is performed, the ESD biased generator 360 would generate voltage levels VESD' and VOFF' on the node Y.

Figure 5C:
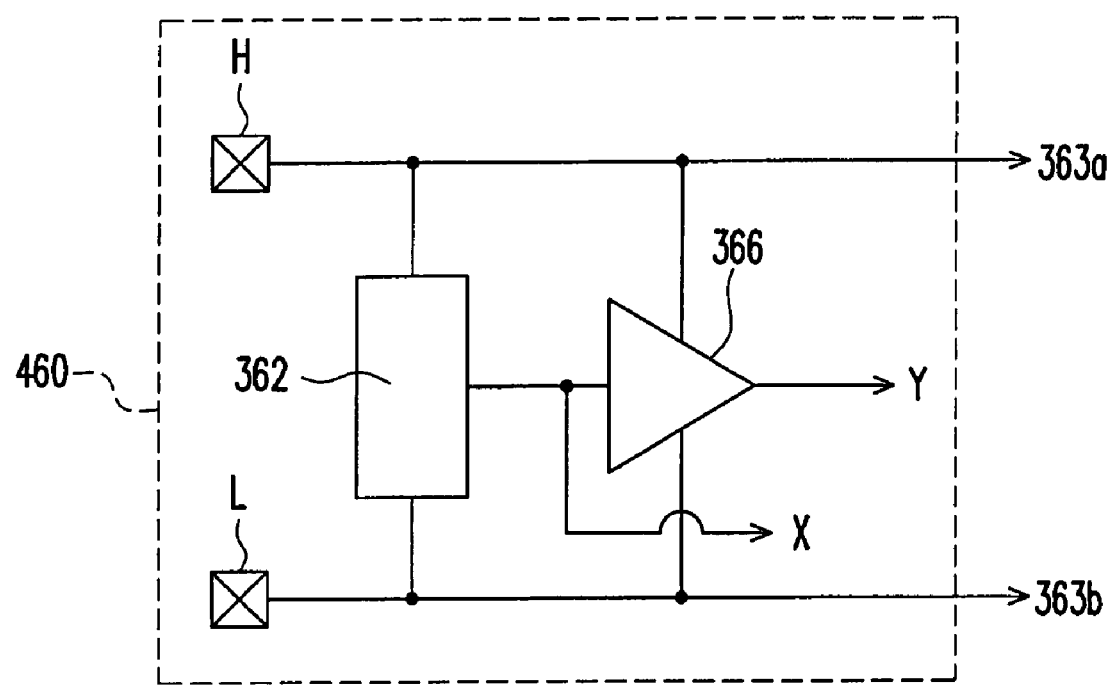

If the ESD protection element on the active device array substrate has four connection terminals, the used ESD biased generator is as shown in FIG. 5C. Referring to FIG. 5C, the ESD biased generator 460 has a plurality of terminals electrically connected to a high voltage terminal H, a low voltage terminal L, a node X and a node Y. The ESD biased generator 460 further has a level controller 362 and an inverter 366 therein. The ESD biased generator 460 is further electrically connected to the diode 363a and the diode 363b. When an ESD event occurs and a normal operation is performed, the ESD biased generator 460 would generate voltage levels VESD and VOFF on the node X and generate voltage levels VESD' and VOFF' on the node Y.

Figure 6A:
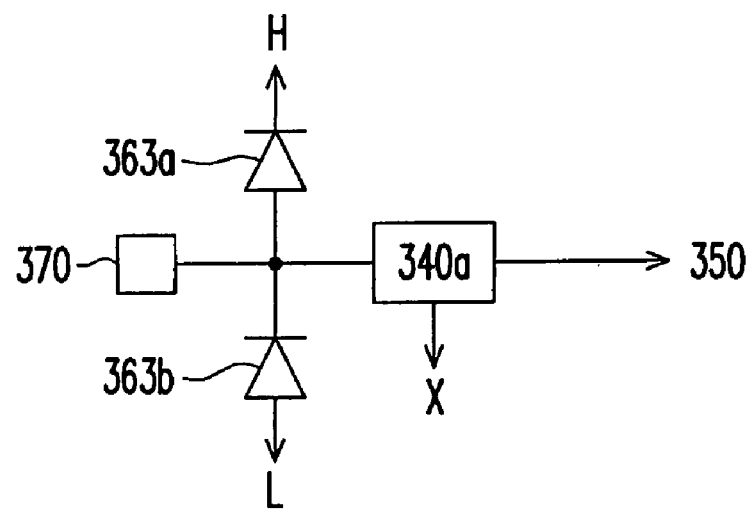
FIGS. 6A-6C are diagrams showing a connection between one of the bonding pad on the TFT array substrate and the ESD biased generator.
Figure 6B:
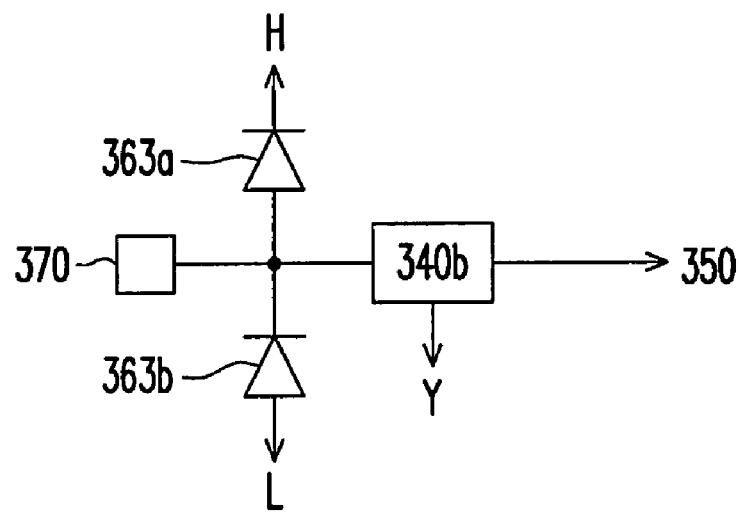

In addition, as shown in FIGS. 6A and 6B, any one of the bonding pads 370 on the active device array substrate shown in FIG. 3 is connected to three devices including the diode 363a, the diode 363b and the ESD protection element 340a or 340b. In an embodiment, as shown in FIG. 6A, the ESD protection element 340a is connected to the X node of the ESD biased generator 360 (FIG. 5A). In another embodiment, as shown in FIG. 6B, the ESD protection element 340b is connected to the Y node of the ESD biased generator 360 (FIG. 5B). The ESD protection element 340a or 340b is further connected to the short ring 350. In the case, the diodes 363a, 363b would supply a current to the ESD and electrically conduct to the high voltage terminal H and the low voltage terminal L, such that the ESD biased generator would work and the ESD current is channelized by the ESD protection element via the voltage level (VESD and VESD') of the node X and the node Y.

Figure 6C:
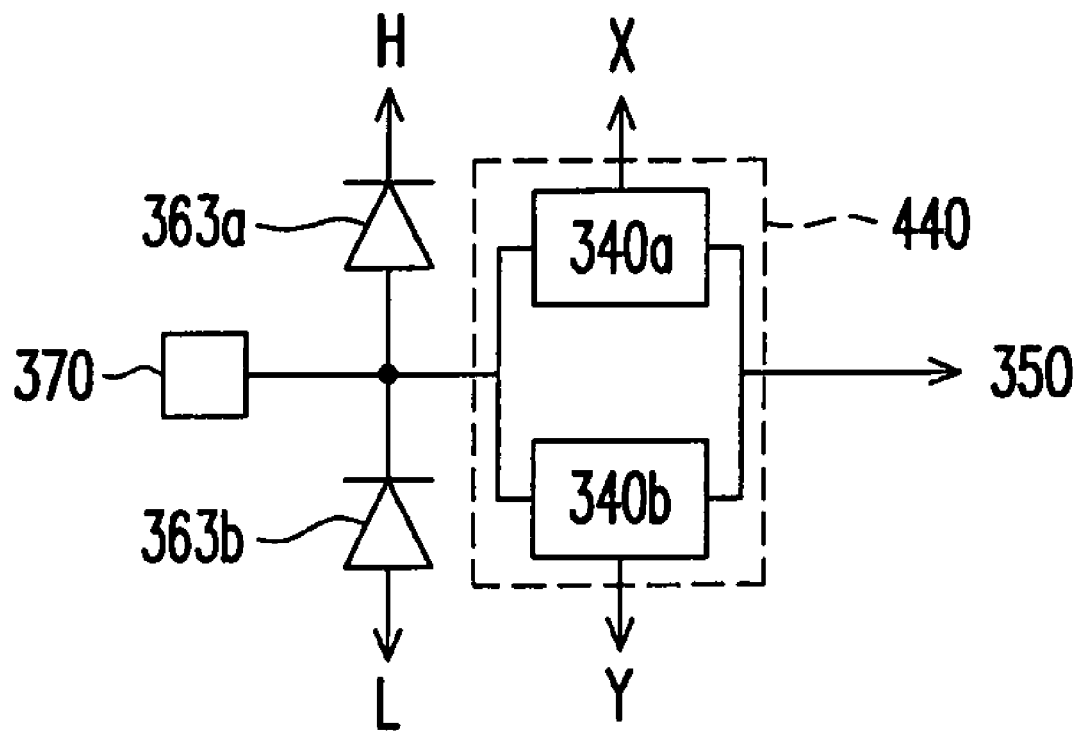

Similarly, if the ESD protection element having four connection terminals are used on the active device array substrate, any one of the bonding pads 370 on the active device array substrate shown in FIG. 4 is connected to three devices including the diode 363a, the diode 363b and the ESD protection element 440 composed of the ESD protection elements 340a, 340b, as shown in FIG. 6C. Two terminals of the ESD protection element 440 are connected to the node X and the node Y, and the other terminal of the ESD protection element 440 is connected to the short ring 350. The diodes 363a, 363b would supply a current to the ESD and electrically conduct to the high voltage terminal H and the low voltage terminal L, such that the ESD biased generator would work and the ESD current is channelized by the ESD protection element via the voltage level (VESD and VESD') of the node X and the node Y.

Figure 7:
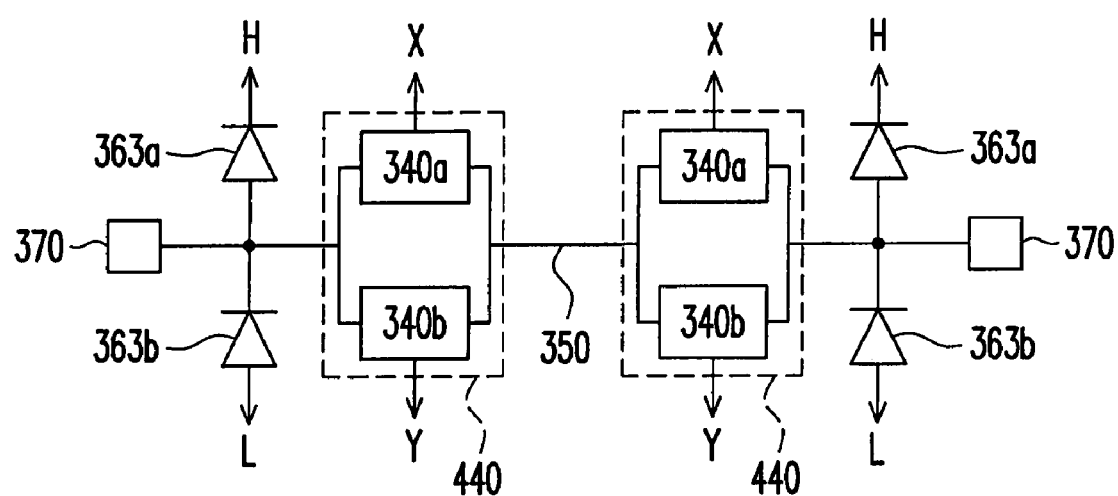
FIG. 7 is diagram showing the ESD protection element and two of the bonding pads on the TFT array substrate.

In details, as shown in FIG. 7, the ESD protection element having four connection terminals is used. Any two of the bonding pads 370 on the active device array substrate are connected to each other through the ESD protection element 440 (composed of the ESD protection elements 340a, 340b) and the short ring 350. That is, when an ESD event occurs, a voltage is generated on the node X and the node Y through the diodes 363a, 363b and the ESD biased generator so as to turn on the ESD protection elements 340a, 340b, such that the ESD energy is released via the short ring 350.

Figure 8:
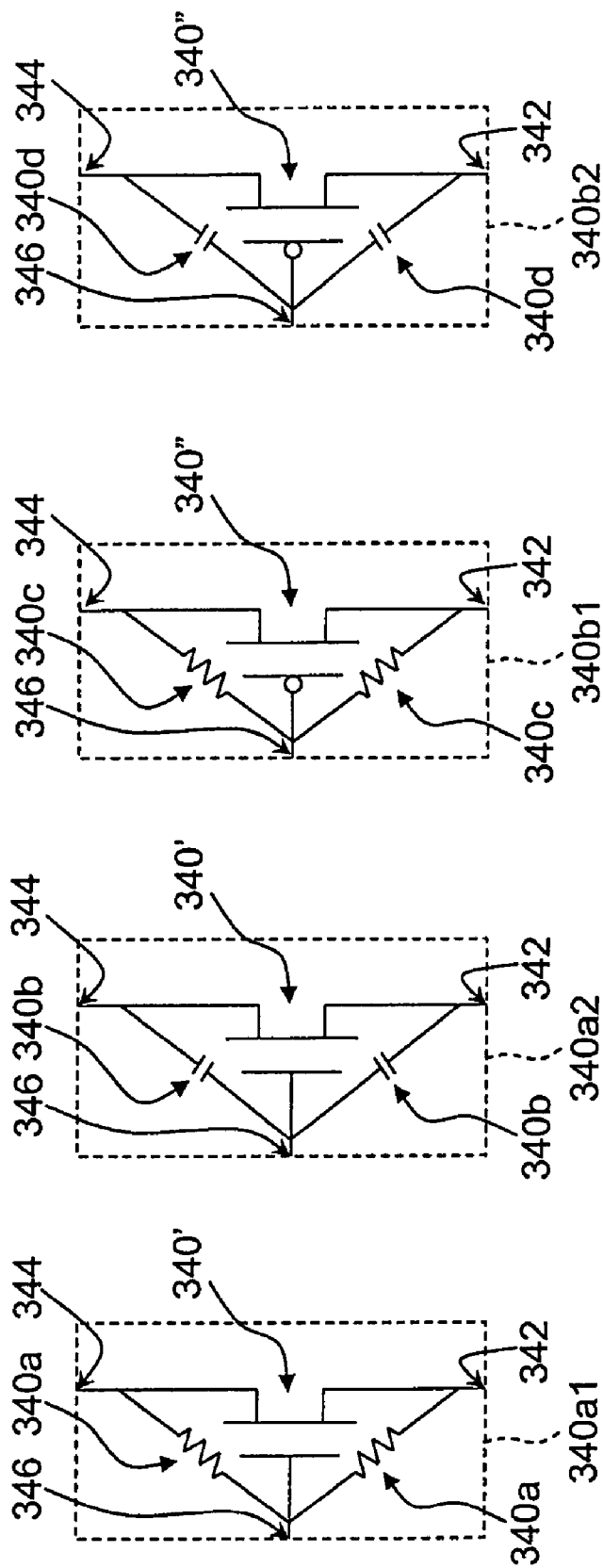
FIGS. 8A~8D are diagrams of the ESD protection elements in different types provided by the present invention.

In addition, the ESD protection element of the present invention can be formed of an N type transistor, a P type transistor or a combination thereof. Also, the ESD protection element can also be formed in other types. In the following, other types of the ESD protection element 340 are described in association with the related figures. FIGS. 8A~8D are diagrams of the ESD protection elements in different types provided by the present invention. Referring to FIG. 8A, the ESD protection element 340a1 includes an N-type transistor 340' and two resistors 340a. The two resistors 340a are respectively electrically connected between the first connection terminal 342 and the third connection terminal 346 of the N-type transistor 340' and between the second connection terminal 344 and the third connection terminal 346 of the N-type transistor 340'. That is, the two resistors 340a are electrically connected between the gate electrode of the N-type transistor 340' and each of the source and the drain electrode of the N-type transistor 340', respectively.

According to other embodiments of the present invention, referring to FIG. 8B, an ESD protection element 340a2 may include an N-type transistor 340' and two capacitors 340b. The two capacitors 340b are respectively electrically connected between the first connection terminal 342 and the third connection terminal 346, and between the second connection terminal 344 and the third connection terminal 346. In addition referring to FIG. 8C, another type ESD protection element 340b1 includes a P-type transistor 340" and two resistors 340c. The two resistors 340c are respectively electrically connected between the first connection terminal 342 and the third connection terminal 346, and between the second connection terminal 344 and the third connection terminal 346. That is, the two resistors 340c are electrically connected between the gate electrode of the P-type transistor 340" and each of the source and the drain electrode of the P-type transistor 340", respectively. Furthermore, referring to FIG. 8D, another ESD protection element 340b2 includes a P-type transistor 340" and two capacitors 340d. The two capacitors 340d are respectively electrically connected between the first connection terminal 342 and the third connection terminal 346, and between the second connection terminal 344 and the third connection terminal 346.

Figure 9:
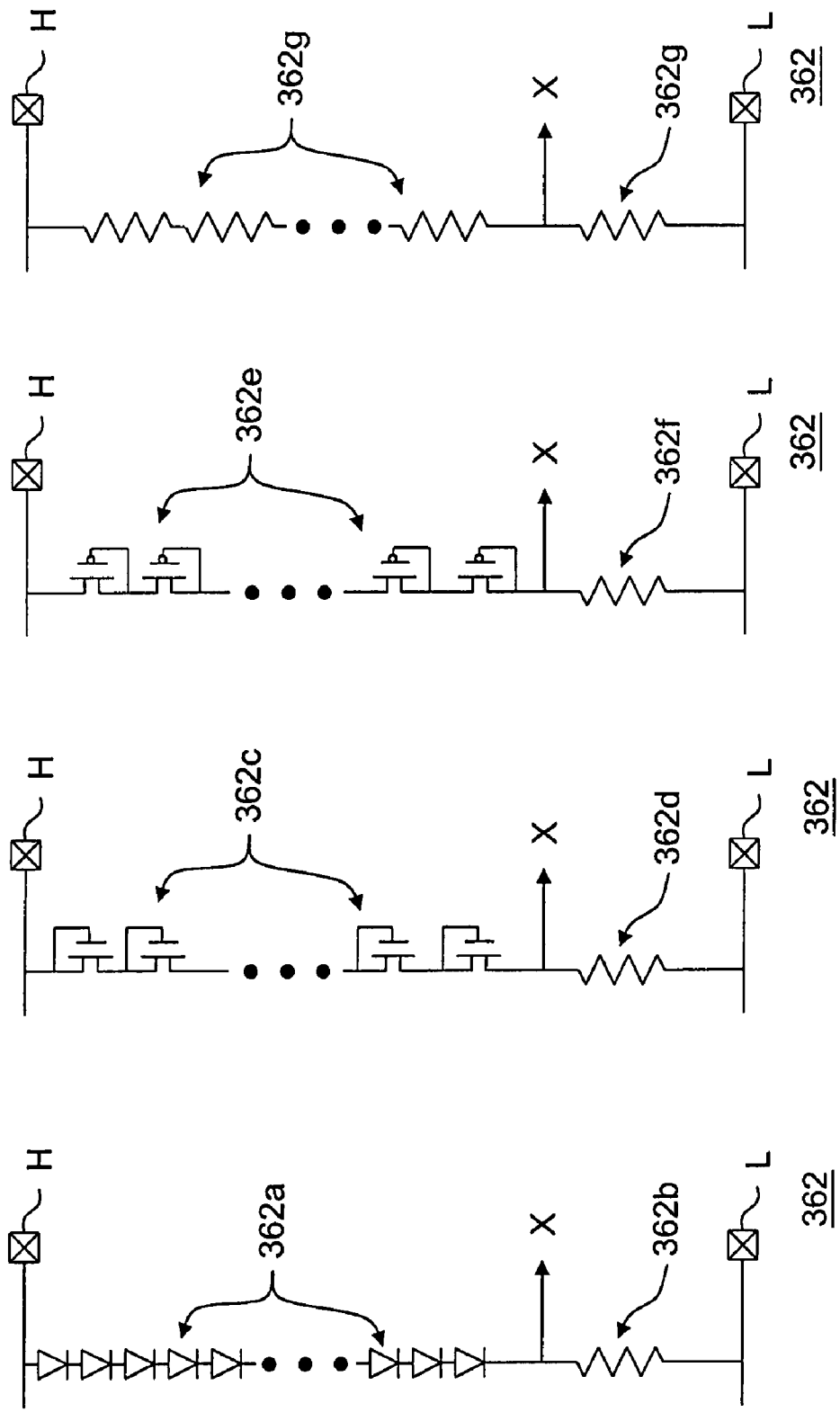
FIGS. 9A~9D are diagrams of the level controllers in different types provided by the present invention.

The level controller 362 of the present invention is described in more detail as follows. FIGS. 9A~9D are diagrams of the level controllers in different types provided by the present invention. Referring to FIG. 9A, the level controller 362 of the present embodiment includes a plurality of diodes 362a in forward series and a resistor 362b in series connection to the diodes 362a, wherein a node X is located between a diode 362a and the resistor 362b. When an ESD event occurs and a normal operation is performed, the ESD biased generator 362 would generate voltage levels VESD, VOFF on the node X.

Note that the level controller 362 of the present invention functions to generate a voltage and the above-described embodiment does not limit the construction of the level controller 362 of the present invention. The level controller 362 is described in more detail as follows in association with the related figures. Referring to FIG. 9B, a level controller 362 of the present embodiment includes a plurality of N-type transistors 362c and a resistor 362d electrically connected to one of the N-type transistors 362c, wherein a node X is located between an N-type transistor 362c and the resistor 362d. Besides, the source electrode of each N-type transistor 362c is electrically connected to the drain electrode of the adjacent N-type transistor 362c, while the gate electrode of each N-type transistor 362c is electrically connected to the source electrode thereof.

Referring to FIG. 9C, similarly to the above described, another type level controller 362 may include a plurality of P-type transistors 362e and a resistor 362f electrically connected to one of the P-type transistors 362e, wherein a node X is located between a P-type transistor 362e and the resistor 362f. Besides, the source of each P-type transistor 362e is electrically connected to the drain of the adjacent P-type transistor 362e, while the gate of each P-type transistor 362e is electrically connected to the drain thereof. Referring to FIG. 9D, another level controller 362 can include a plurality of resistors 362g in series only, wherein a node X is located between two certain adjacent resistors 362g.

Figure 10:
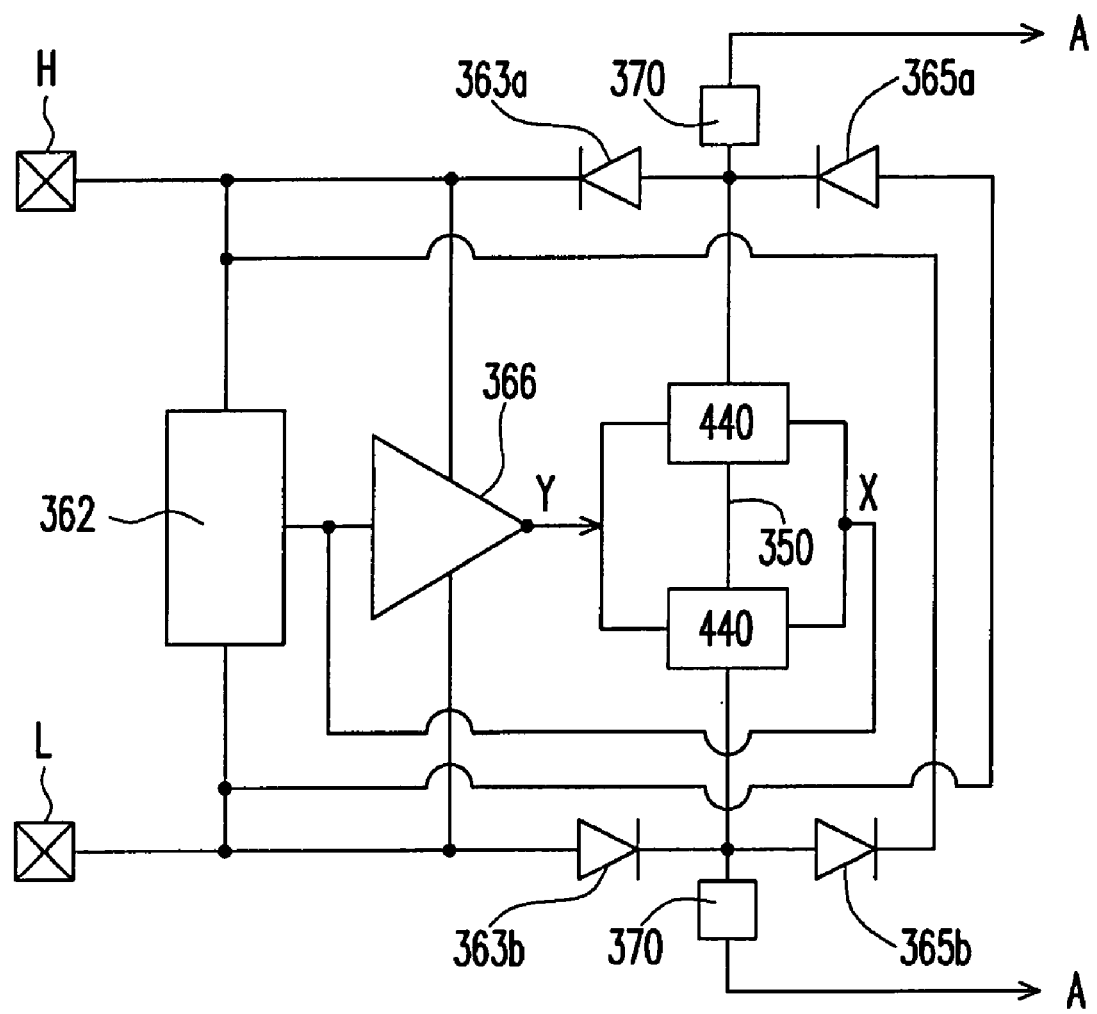
FIG. 10 is a diagram of the local equivalent circuit of the active device array substrate in FIG. 4.

The ESD protection mechanism on the active device array substrate is described in the following. Generally, when the ESD stress occurs, there are one position at a high ESD voltage level and one position at a low ESD voltage level on the active device array substrate. The ESD charges always discharge from the high voltage level to the low voltage level. If the ESD protection element is not existed on the active device array substrate, the pixel units will be damaged by the high energy ESD. FIG. 10 is a diagram of the local equivalent circuit of the active device array substrate in FIG. 4. Referring to FIG. 10, when the ESD charges are accumulated to a level and the ESD event occurs on one of the bonding pads 370, a current is released to the level controller 362 via the diodes 363a so as to generate a voltage, and a voltage level VESD larger than the threshold voltage of the N type TFT of the ESD protection element 440 is generated at the node X. At the same time, a voltage level VESD' larger than the threshold voltage of the P type TFT is generated at the node Y through the inverter 366. Thereby, the N type TFT and the P type TFT of the ESD protection element are conducted to each other, such that the ESD charges are conducted to the lowest voltage level on the active array substrate. Moreover, when the active device array substrate is normally operated, which is the active device array substrate is operated with an external applied voltage, the high voltage terminal H and the low voltage terminal L of the ESD biased generator would supply a voltage level and a voltage is formed through the level controller 363. Then, a voltage level VOFF smaller than the threshold voltage of the N type TFT is generated at the node X, and a voltage level VOFF' smaller than the threshold voltage of the P type TFT is generated at the node Y. Therefore, the N type TFT and the P type TFT of the ESD protection element 440 are turned off. The two bonding pads 370 are open-circuit, such that a current leakage does not happen between the two binding pads 370 when the active device array substrate is normally operated.

In summary, the active device array substrate of the present invention has at least the following advantages:

1. As an ESD stress occurs, the ESD biased generator would sense the electrostatic voltage and provide a voltage to the ESD protection elements to turn on the ESD protection elements, which allows the accumulated electrostatic charges to be quickly conducted to the short ring, thus, an ESD failure to damage the pixel units is avoided.
2. During the active device array substrate is operated, the voltage difference between the two applied voltages can be reduced by adjustment, which contributes to lower the energy consumed by the leakage current and advance the quality of the active device array substrate.

It will be apparent to those skilled in the art that various modifications and variations can be made to the structure of the present invention without departing from the scope or spirit of the invention. In view of the foregoing, it is intended that the specification and examples to be considered as exemplary only, with a true scope and spirit of the invention being indicated by the following claims and their equivalents.

What is claimed is:

1. An active device array substrate, comprising:
    a plurality of scan lines and a plurality of data lines;
    a plurality of pixel units, being electrically connected to the corresponding scan lines and data lines, respectively;
    a plurality of electrostatic discharge (ESD) protection elements, wherein each ESD protection element has a first connection terminal, a second connection terminal and a third connection terminal, and the first connection terminal is electrically connected to one of the corresponding scan line and data line;

a short ring electrically connected to the second connection terminal of each ESD protection element; and a conductive wire electrically connected to the third connection terminal of each ESD protection element, wherein the conductive wire is not connected to the short ring;

an ESD biased generator electrically connected to the conductive wire, wherein the ESD biased generator is not directly connected to the short ring, and the conductive wire directly connects with the ESD biased generator and the third connection terminal of each ESD protection element, wherein, as an ESD stress occurs, the ESD biased generator would sense an electrostatic voltage and provide a voltage to the ESD protection elements to turn on the ESD protection elements, so that the accumulated electrostatic charges are conducted to the short ring.

2. The active device array substrate as recited in claim 1, wherein the ESD biased generator comprises a level controller having a node, and the node is electrically connected to the third connection terminals of the ESD protection elements.

3. The active device array substrate as recited in claim 2, wherein the level controller comprises at least a diode in forward series and a resistor connected in series to the diode.

4. The active device array substrate as recited in claim 2, wherein the level controller comprises at least a transistor and a resistor electrically connected to the transistor, and the source electrode of the transistor is electrically connected to the drain electrode of the adjacent transistor and the gate electrode of the transistor is electrically connected to one of the source and drain electrode thereof.

5. The active device array substrate as recited in claim 2, wherein the level controller comprises at least a resistor in series.

6. The active device array substrate as recited in claim 1, wherein the ESD protection element comprises an N type transistor, a P type transistor or a combination thereof.

7. The active device array substrate as recited in claim 6, wherein the ESD protection element further comprises two resistors, and the two resistors are electrically connected between the first connection terminal and the third connection terminal, and between the second connection terminal and the third connection terminal, respectively.

8. The active device array substrate as recited in claim 6, wherein the ESD protection element further comprises two capacitors, and the two capacitors are electrically connected between the first connection terminal and the third connection terminal, and between the second connection terminal and the third connection terminal, respectively.

9. The active device array substrate as recited in claim 2, wherein the ESD protection element comprises an N type transistor, a P type transistor or a combination thereof, and the ESD biased generator further comprises an inverter electrically connected between the node and the third connection terminals of the ESD protection elements.

10. The active device array substrate as recited in claim 9, wherein the ESD protection element further comprises two resistors, and the two resistors are electrically connected between the first connection terminal and the third connection terminal, and between the second connection terminal and the third connection terminal, respectively.

11. The active device array substrate as recited in claim 9, wherein the ESD protection element further comprises two capacitors, and the two capacitors are electrically connected between the first connection terminal and the third connection terminal, and between the second connection terminal and the third connection terminal, respectively.

12. The active device array substrate as recited in claim 9, wherein each ESD protection element further comprises a fourth connection terminal electrically connected to the ESD biased generator.

13. The active device array substrate as recited in claim 12, wherein the ESD biased generator comprises a level controller and an inverter having a node, and the node is electrically connected to the third connection terminals of the ESD protection elements and an input terminal of the inverter, while an output terminal of the inverter is electrically connected to the fourth connection terminals of the ESD protection elements.

14. The active device array substrate as recited in claim 13, wherein the level controller comprises at least a diode in forward series and a resistor connected in series to the diode.

15. The active device array substrate as recited in claim 13, wherein the level controller comprises at least a transistor and a resistor electrically connected to the transistor, and the source electrode of the transistor is electrically connected to the drain electrode of the adjacent transistor and the gate electrode of the transistor is electrically connected to one of the source and drain electrode thereof.

16. The active device array substrate as recited in claim 13, wherein the level controller comprises at least a resistor in series.

17. The active device array substrate as recited in claim 12, wherein the ESD protection element comprises a transmission-gate transistor.

* * * * *